US008803201B2

(12) United States Patent
Andrews

(10) Patent No.: US 8,803,201 B2
(45) Date of Patent: Aug. 12, 2014

(54) SOLID STATE LIGHTING COMPONENT PACKAGE WITH REFLECTIVE LAYER

(75) Inventor: Peter Andrews, Durham, NC (US)

(73) Assignee: Cree, Inc., Durham, NC (US)

(*) Notice: Subject to any disclaimer, the term of this patent is extended or adjusted under 35 U.S.C. 154(b) by 555 days.

(21) Appl. No.: 13/017,778

(22) Filed: Jan. 31, 2011

(65) Prior Publication Data

US 2012/0193647 A1    Aug. 2, 2012

(51) Int. Cl.
*H01L 33/60* (2010.01)
*H01L 33/46* (2010.01)
*H01L 33/50* (2010.01)

(52) U.S. Cl.
CPC .............. *H01L 33/60* (2013.01); *H01L 33/46* (2013.01); *H01L 33/507* (2013.01)
USPC ............................................. 257/198; 438/29

(58) Field of Classification Search
CPC ....... H01L 33/46; H01L 33/507; H01L 33/56; H01L 33/60
USPC ............................................... 257/98; 438/29
See application file for complete search history.

(56) References Cited

U.S. PATENT DOCUMENTS

| | | | |
|---|---|---|---|
| 6,436,331 B1 * | 8/2002 | Kuno et al. | 264/510 |
| 6,642,652 B2 * | 11/2003 | Collins et al. | 313/512 |
| 6,959,489 B2 * | 11/2005 | Beroz et al. | 29/840 |
| 7,374,807 B2 * | 5/2008 | Parce et al. | 428/76 |
| 7,456,449 B2 * | 11/2008 | Fujiwara et al. | 257/231 |
| 7,871,834 B2 * | 1/2011 | Ogihara et al. | 438/23 |
| 7,919,780 B2 * | 4/2011 | Lee | 257/79 |
| 8,232,118 B2 * | 7/2012 | Mitsuishi et al. | 438/22 |
| 2007/0223219 A1 | 9/2007 | Medendorp et al. | |
| 2011/0001148 A1 * | 1/2011 | Sun et al. | 257/88 |

OTHER PUBLICATIONS

Yuan, Thomas Cheng-Hsin, et al., High Reflective Substrate of Light Emitting Devices with Improved Light Output, U.S. Appl. No. 12/757,179, filed Apr. 9, 2010.
Lee, Kwang-Cheol, et al., "The effects of titania diffuser on angular color homogeneity in the phosphor conformal coated with LEDs", Proc. of SPIE, vol. 7784, pp. 778410-1-778410-6.

* cited by examiner

*Primary Examiner* — Evan Pert
(74) *Attorney, Agent, or Firm* — Christopher J. Knors; Moore & Van Allen PLLC

(57) ABSTRACT

A solid state lighting package is provided. The package comprising at least one LED element positioned on a top surface of a substrate or a submount capable of absorbing light emitted by the at least one LED element; and a reflective layer, the reflective layer covering at least a portion of the top surface of the substrate or the submount, whereby at least of portion of the light emitted by the LED element is reflected by the reflective layer. A method of manufacturing a solid state lighting package comprising the reflective layer, and a method of increasing the luminous flux thereof, is also provided.

89 Claims, 12 Drawing Sheets

PROVING AN ARRAY OF LED ELEMENT MOUNTED ON LIGHT ABSORBING SUBSTRATE, THE ARRAY OF LED ELEMENTS FORMING AT LEAST ONE CHANNEL THEREBETWEEN

401

INTRODUCING TO THE LED ELEMENT AND SUBSTRATE A TRANSPARENT MATRIX COMPRISING ONE OR MORE OF A HIGHLY REFLECTIVE MATERIAL AND A FOAMING AGENT, THE MATRIX HAVING A VISCOSITY CAPABLE OF BEING DRAWN BY CAPILLARY ACTION ("WICKED") INTO THE AT LEAST ONE CHANNEL

403

FORMING A REFLECTIVE LAYER IN PROXIMITY TO THE LED ELEMENT AND AT LEAST PARTIALLY COVERING THE SUBSTRATE

405

OPTIONALLY MOUNTING A METAL REFLECTOR ELEMENT TO THE SUBSTRATE

407

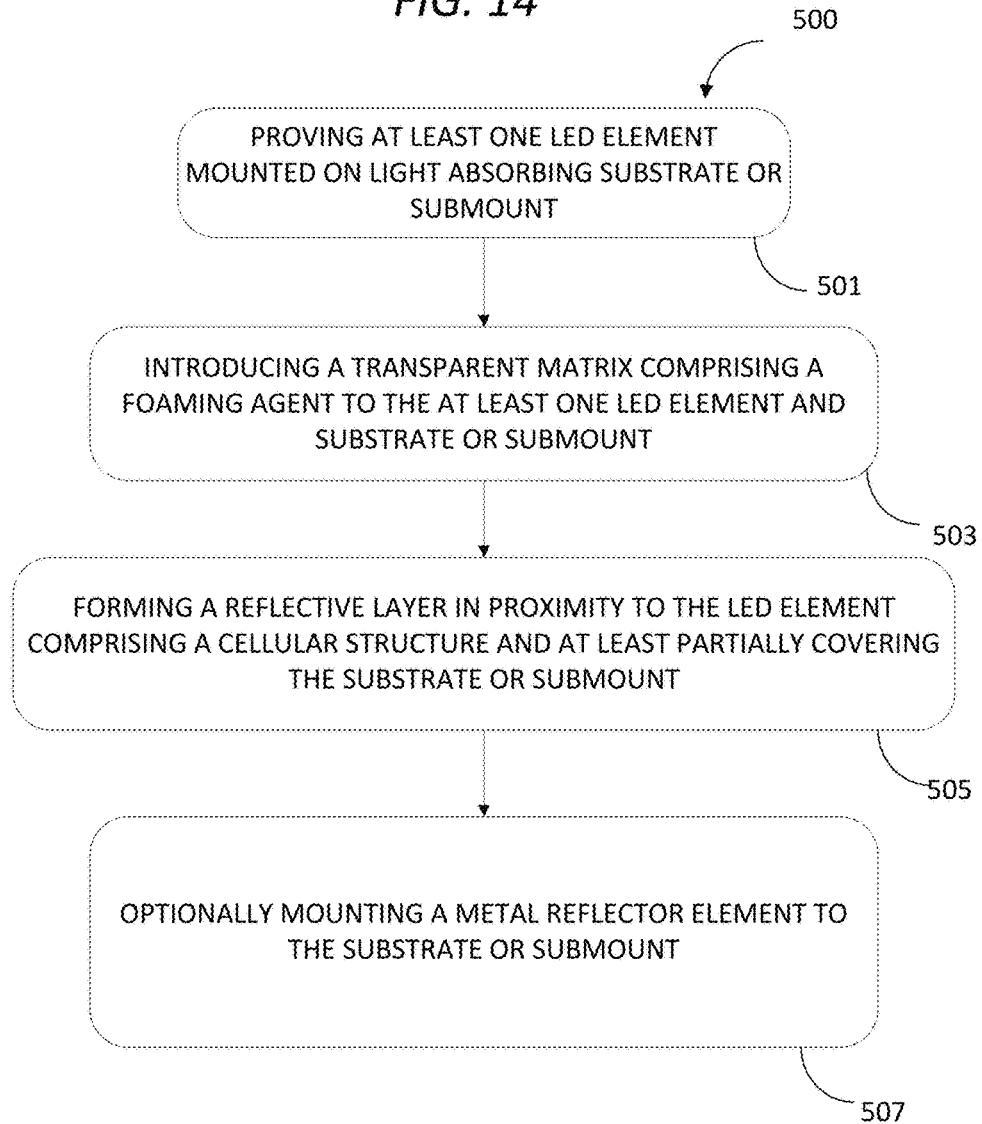

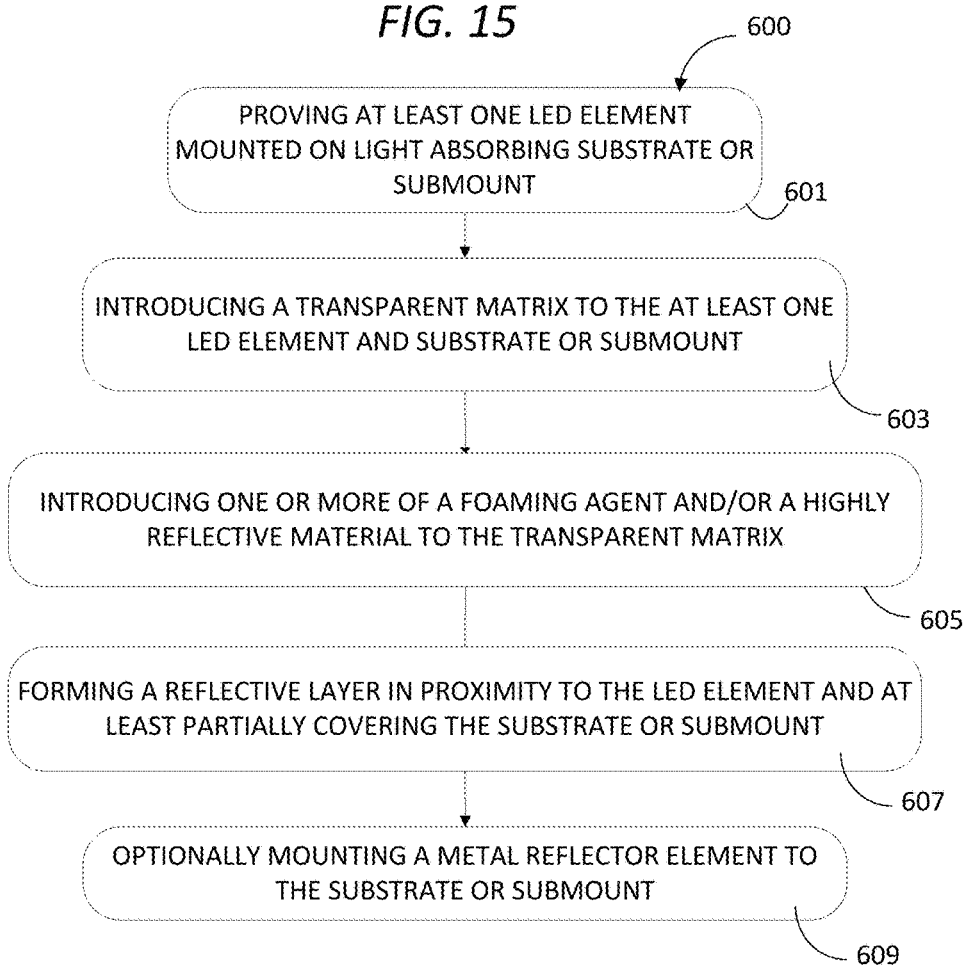

SOLID STATE LIGHTING COMPONENT PACKAGE WITH REFLECTIVE LAYER

TECHNICAL FIELD

The present disclosure relates to a solid state lighting package and a manufacturing method thereof, and more specifically, to a solid state lighting package comprising a reflective layer having high reflectivity.

BACKGROUND

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1a, a single LED chip 12 is mounted on a reflective cup 13 by means of a solder bond or conductive epoxy. One or more wire bond connections 11 connect the ohmic contacts of the LED chip 12 to leads 15A and/or 15B, which may be attached to or integral with the reflective cup 13. The reflective cup may be filled with an encapsulant material 16 containing a wavelength conversion material such as a phosphor so that light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces).

A conventional LED package 20 illustrated in FIG. 1b may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wire bond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

Current LED packages (e.g. XLamp™ LEDs provided by Cree, Inc.) incorporate one LED chip and higher light output is achieved at the assembly level by mounting several of these LED packages onto a single circuit board. FIG. 2 shows a sectional view of one such distributed integrated LED array 30 comprising a plurality of LED packages 32 mounted to a substrate or submount 34 to achieve higher luminous flux. Typical arrays include many LED packages, with FIG. 2 only showing two for ease of understanding. Alternatively, higher flux components have been provided by utilizing arrays of cavities, with a single LED chip mounted in each of the cavities. (e.g. TitanTurbo™. LED Light Engines provided by Lamina, Inc.)

These LED array solutions may be less compact than desired, as they include extended non-light emitting "dead space" between adjacent LED packages. This dead space can result in larger devices, and can provide for non-light emitting structures that can absorb light and reduce the total luminous flux of the LED package. The above solutions present challenges in providing a compact LED lamp structure incorporating an LED component that delivers light flux levels in the 1000 Lumen and higher range from a small optical source. Moreover, to achieve desired beam shapes, individual optical lenses are typically mounted with each LED component, or very large reflectors (larger than the form of existing conventional sources) have to be employed. These secondary optical elements (lenses or reflectors) are large and costly, and any light being reflected from the sidewalls in the packages and cavities can also result in additional optical losses, making these overall LED components less efficient. As a result, the luminance of a LED package is significantly affected by its package structure.

It is also generally observed that LED's perform best when operating temperatures are minimized. Thus, it is generally desirable to remove heat from the LED, typically by heat transfer via the substrate or submount. One of the best ceramic substrates for heat transfer is aluminum nitride (AlN). However, at least one problem with AlN as a heat transfer material in a LED package is that it is dark brown in color upon deposition, which absorbs visible light and reduces the total luminous flux of the package. Conventional technology is to cover as much of the heat transfer material and/or dead space areas with reflective metal, or with white soldermask to maximize reflectivity while at the same time providing heat transfer. Unfortunately, metal cannot be applied everywhere in high density LED packages due to its electrical conductive properties. Typically, a 75-150 micron gap between areas of different potential in such packages is provided, which results in significant total dead space area having, for example, dark brown AlN in proximity to the light emitting elements. Soldermask is widely used because it is photo-imageable, or screen printable, but the material properties and application methods preclude its use in all conditions. White soldermask also discolors after solder reflow or with time and with photon exposure adding to the other existing problems of lumen loss and color shift. There is also a significant amount of area (e.g., known as "canyon walls") between light emitting elements that also absorb or poorly reflect the luminous light. These conventional solutions are, for the most part, inadequate for maximizing the total luminous flux of a solid state lighting package.

SUMMARY

The present disclosure provides solutions to the above-mentioned problems by providing a reflective layer to a solid state lighting package and means to apply such reflective layer. The reflective layer comprises a transparent matrix comprising a highly reflective material dispersed, distributed, and/or suspended therein. The reflective layer, by proper selection of the transparent matrix and the highly reflective material, can also provide electrical insulation to the plurality of LED elements, such that the spacing between the LED elements and/or other elements of the LED package can be minimized to the greatest extent possible. In one aspect, the substrate or submount is or includes one or more ESD elements, the reflective layer covering at least a portion thereof.

Thus, in a first embodiment, a solid state lighting package is provided. The package comprising at least one LED element positioned on a top surface of a substrate or a submount capable of absorbing light emitted by the at least one LED element; a reflective layer comprising a transparent matrix comprising a highly reflective material, the transparent matrix being substantially transparent to wavelengths of light emitted by the at least one LED element; the reflective layer in proximity to the at least one LED element and covering at least a portion of the top surface of the substrate or the submount, whereby at least of portion of the light emitted by the LED element is reflected by the reflective layer.

In a second embodiment, a method of manufacturing a solid state lighting package is provided. The method comprising providing at least one LED element mounted on a substrate or submount; introducing a transparent matrix comprising a highly reflective material to the at least one LED element and the substrate or submount; and forming a reflective layer in proximity to the at least one LED element and covering at least a portion of the substrate or submount.

In a third embodiment, a method of increasing the luminous flux of a solid state lighting package is provided. The method comprising providing a solid state lighting package having at least one LED element mounted on a substrate or submount capable of absorbing light emitted by the at least one LED element; providing a reflective layer comprising a transparent matrix comprising a highly reflective material, the reflective layer in proximity to the at least one LED element and covering at least a portion of the substrate or submount; and reflecting light emitted by the at least one LED element by the reflective layer, thereby increasing the luminous flux of the solid state lighting package.

In a fourth embodiment, a solid state lighting package is provided, the package comprising at least one LED element positioned on a top surface of a substrate or a submount capable of absorbing light emitted by the at least one LED element; and a reflective layer comprising a transparent matrix comprising a cellular structure capable of reflecting the light emitted by the LED element, the reflective layer in proximity to the at least one LED element and covering at least a portion of the top surface of the substrate or the submount, whereby at least of portion of the light emitted by the LED element is reflected by the reflective layer.

In a fifth embodiment, a method of manufacturing a solid state lighting package is provided. The method comprising providing at least one LED element mounted on a substrate or submount; introducing a transparent matrix comprising a foaming agent to the at least one LED element and the substrate or submount; and forming a reflective layer comprising a cellular structure in proximity to the at least one LED element and covering at least a portion of the substrate or submount.

In a sixth embodiment, a method of increasing the luminous flux of a solid state lighting package is provided. The method comprising providing a solid state lighting package having at least one LED element mounted on a substrate or submount capable of absorbing light emitted by the at least one LED element; providing a reflective layer covering at least a portion of the substrate or submount, wherein the reflective layer comprises a transparent matrix comprising a cellular structure; and reflecting light emitted by the at least one LED element by the reflective layer, thereby increasing the luminous flux of the solid state lighting package.

BRIEF DESCRIPTION OF THE DRAWINGS

FIG. 13 is a flow chart of another manufacturing embodiment of an LED component according to the present disclosure;

FIG. 14 is a flow chart of another manufacturing embodiment of an LED component according to the present disclosure; and FIG. 15 is a flow chart of another manufacturing embodiment of an LED component according to the present disclosure.

DETAILED DESCRIPTION

Figure 1A:
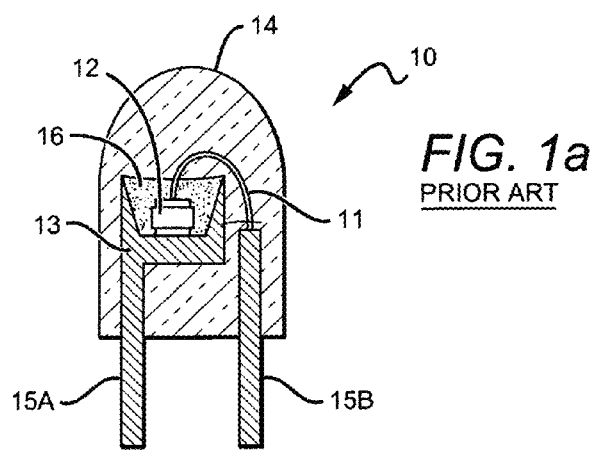
FIG. 1 shows a sectional view of an embodiment of prior art LED lamp.
Figure 1B:
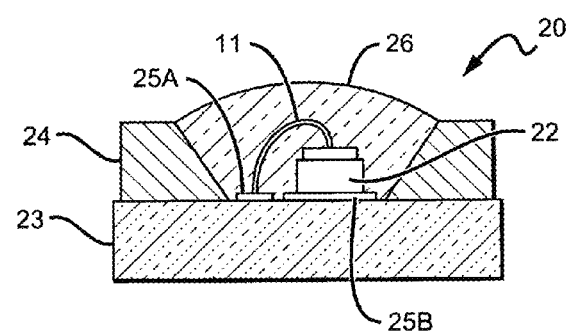
Figure 2:
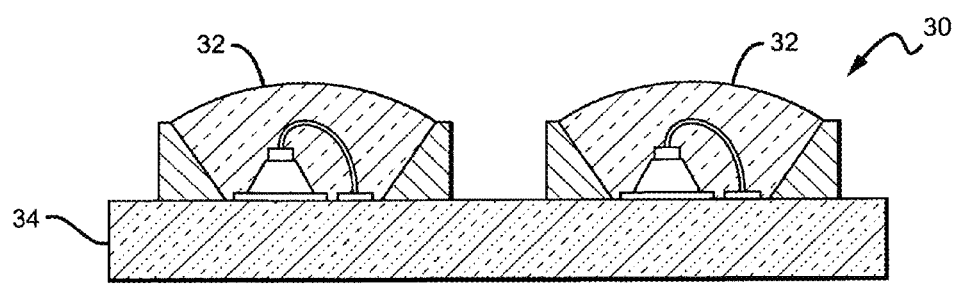
FIG. 2 shows a sectional view of one embodiment of a prior art LED component.

A solid state lighting package having a reflective layer and a manufacturing method thereof according to exemplary embodiments of the present disclosure will be described along with reference to the accompanying drawings. Reference is made to a solid state lighting package, however, any light emitting diode (LED) package is envisaged using the reflective layer according to the present disclosure. LED packages disclosed herein are inclusive of all surface mounted devices (SMD) type packages. Examples of solid state lighting packages include ceramic packages, polyimide packages, lead frame package, and combinations thereof.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

In a first embodiment, at least one LED element positioned on a top surface of a substrate or a submount capable of absorbing light emitted by the at least one LED element; and a reflective layer, the reflective layer at least partially surrounding the at least one LED element, and covering at least a portion of the top surface of the substrate or the submount, whereby at least of portion of the light emitted by the LED element is reflected by the reflective layer is provided. In one aspect, the reflective layer touches the at least one LED element. The reflective layer comprises a transparent matrix comprising at least one highly reflective material contained therein. The reflective layer can be employed in combination with a metal reflector element to increase luminous efficacy and minimize loss of luminous flux of the LED package. The reflective layer according to the present disclosure can be applied to a LED package and improve the luminous flux of emitted warm white light or cool white light. In another aspect, the reflective layer can be applied to a LED package and improve a color rendering index of emitted white light.

In one aspect, the lighting package comprises a plurality of LED elements in a densely packed arrangement. In one aspect, the plurality of LED elements are arranged on the substrate so as to form channels therebetween. In this aspect, the reflective layer is introduced into the channels between the plurality of LED elements after die attachment and wire bonding.

Reflective Layer

In one aspect, the reflective layer is comprised of a transparent matrix comprising a predetermined loading of at least one high index of refraction material dispersed, distributed, and/or suspended therein. The transparent matrix can be organic, inorganic, or a mixture thereof. Preferably, the transparent matrix has an index of refraction that is lower than that of the high index of refraction material. For example, the transparent matrix can have an index of refraction of less than about 1.6, preferably less than about 1.5. Preferably, the transparent matrix is transparent in the visible spectra and/or at least a portion of the UV region (e.g., from about 200 nanometers to about 850 nanometers). Preferably, the transparent matrix is at least 85% transparent in the visible spectra and/or at least a portion of the UV region corresponding to the wavelength(s) of the LED light emitted from the package, more preferably, the transparent matrix is at least 90% transparent, most preferably, the transparent matrix is greater than or equal to at least 95% transparent.

The combination of transparent matrix and highly reflective material provides a reflective layer that is generally opaque and/or translucent in appearance, in part due to the loading and/or average particle size of the reflective material. In one aspect, the reflective layer after introduction to the LED package is a translucent or opaque white or off-white in appearance. In other aspects, the addition of phosphors to the reflective layer will provide a colored translucent or opaque reflective layer.

In another aspect, the reflective layer is comprised of a transparent polymer matrix comprising a cellular foam structure capable of reflecting the light emitted by the LED element. The foamed transparent polymer matrix can be organic, inorganic, or a mixture thereof. Preferably, the foamed transparent matrix has a foam cell density and/or average cell size sufficient to reflect the incident light of the at least one LED chip. The cellular foam structure of the transparent matrix can be open, closed, semi-interconnected, semi-closed, or a mixture of any ratio thereof. In some aspects, the average cell diameter is about 0.1 micron to about 50 micron, or about 1 micron to about 10 micron. Smaller or larger cell diameters may be used. Particles can be used in the foamed transparent matrix to provide nucleation sites and/or provide additional reflectivity to the matrix. Suitable particles include highly refractive materials as further discussed below. In other aspects, the reflective layer comprising a transparent matrix with a cellular structure is essentially free of particulate matter. The foamed transparent matrix can be formed "in-situ" on the LED package using conventional foaming manufacturing processes for polymers, such as the incorporation of one or more of a gas, a gas-generating compound, and a solvent-extractable compound. Such processes include, but are not limited to the incorporation of foaming agents such as blowing agents (HFC's, $CO_2$, $N_2$, etc), gas-generating compounds (carbonates, azides, etc.) solvent-extractable compounds (NaCl, KCl, etc) and the like into molten or solvent-cast-able forms of the transparent matrix. The formed foamed transparent polymer matrix can also be surface textured so as to further provide reflectivity of the emitted LED light. In one aspect, spray-in-place foamable polyurethanes and/or poly (meth)acrylic elastomers can be used as the transparent matrix. Leveling and/or masking techniques may be used to control the application of the foamed transparent polymer matrix in the LED package.

Suitable transparent matrix materials (and precursor materials) include transparent organic polymers. Suitable transparent organic polymers include silicones, siloxanes, polyesters, polyurethanes, acrylics (e.g., polyacrylates, polymethacrylates, hereafter "poly(meth)acrylates"), epoxies, fluoropolymers, polyolefins, and co-polymer and/or combinations thereof. In one aspect polydimethylsiloxanes, polydimethylphenylsiloxanes, polyphenylsiloxanes, or blends are employed. Other polydialkyl-, polydialkylphenyl-, polydialkylalkylphenyl- and polyalklyphenyl-siloxane polymers can be substituted for the above transparent matrix. Mixtures, copolymers, and blends of these siloxanes can be used. In one aspect, polydimethylsiloxane and/or polyphenylsiloxanes having sufficient pre-cure viscosities for introduction to the LED package that cure to a gel or hard durometer layer are preferred.

The highly refractive material can be any material with a high index of refraction. In one aspect, the highly refractive material has an index of refraction of greater than about 1.8, greater than about 2, preferably greater than about 2.2, and most preferably greater than or equal to about 2.4. Suitable examples of high index of refraction material include inorganic compounds, such as titanium dioxide (n=2.4), zinc oxide, zinc sulfide, barium sulfate, boron nitride, talc, silica, alumina, zeolite, calcium carbonate, magnesium carbonate, barium sulfate, zinc oxide, titanium oxide, aluminum hydroxide, magnesium hydroxide, mica, montmorillonite clay, carbon particles, glass particles, carbon nanotubes, and mixtures thereof. The amount of high index of refraction material that can be used will at least depend, in part, on the choice of transparent matrix chosen. To provide suitable reflectivity, while not negatively affecting the viscosity and/or curing and/or dispensability of the transparent matrix, the loading of the high index of refraction material can be between about 3 weight percent to about 50 weight percent. Excess amounts of the high index of refraction material may result in delaminating of the reflective layer and/or poor dispensing/dispersion of the material in the matrix. Insufficient amounts of the high index of refraction material may result in insignificant gains in total luminous flux for the package. In one exemplary aspect, about 6 to about 15 wt. % of the high index of refraction material is used in the transparent matrix. In one aspect, the reflective layer is configured so that when introduced to the LED package it will provided the reflective layer at a predetermined thickness, preferably a thickness less than or equal to the height of a light emitting surface of the substrate/submount mounted LED element.

In certain aspects, the reflective layer is comprised of one or more solid materials of about 2.4 index of refraction contained in the transparent matrix of less than about 1.5 index of refraction. For example, in one aspect, a predetermined amount of titanium dioxide ($TiO_2$) comprising a two part, clear silicone matrix can be employed. Titanium dioxide can be present in one or more forms, e.g., rutile, anatase, and brookite. The average particle size of the titanium dioxide particles in the transparent matrix can be between about 1 nanometer (nanoparticles) to about 500 microns. In certain aspects, the size of the titanium dioxide particles is between about 0.1 to about 10 microns, about 0.5 to about 5 microns, or a size distribution mixture can be used. The titanium dioxide can be added to either part (Part A and/or Part B) or both parts of a two-part matrix (e.g., silicone and/or epoxy resin).

In other aspect, the LED package comprises a plurality of LED elements post die attached and wire bonded, the reflective layer covering at least a portion of the substrate or submount and at least partially surrounding the LED elements. In another aspect, the LED package comprises a plurality of LED elements post die attached and wire bonded, the reflective layer covering at least a portion of the substrate or submount and touching the LED elements. As discussed further below, the reflective layer is substantially prevented from covering the light emitting surface(s) of the LED element(s). In one aspect, the reflective layer can be configured to be essentially planar with the top surface of the LED element(s) so as to improve secondary optics, for example. This configuration provides LED packages with enhanced brightness by increasing the amount of reflected light compared to a LED package post die attached and wire bonded without the reflective layer herein disclosed. In other aspects the reflective layer is non-planner and/or does not completely surround and/or reach the highest vertical height of the LED element.

In one aspect as further discussed below, the reflective layer can include one or more color shifting elements. The color shifting element can be included in the transparent matrix, for example, dispersed or distributed with the highly reflective material. In other aspects, the color shifting element layer can be configured in a separate layer that can be adjacent to, on and/or under the reflective layer, e.g., in a multi-layer configuration. In such aspects, different color shifting elements and/or equal or unequal amounts of one or more color shifting elements can be distributed among one or more of the multi-layers. Combinations of the above described configurations of transparent matrix, highly reflective material, and color shifting element can be employed.

In other aspect, the LED package comprises a plurality of LED elements (arrays) post die attached and wire bonded, the reflective layer covering the substrate or submount and the sidewalls of the LED elements and channels between the array elements. As discussed further below, the reflective layer is substantially surrounds the edges of the LED elements, exposes the top surface of the plurality of LED elements, and covers the substrate surface to which the LED element is attached. This configuration provides LED packages with enhanced brightness by increasing the amount of reflected light relative to a LED package post die attached and wire bonded without the reflective layer herein disclosed.

LED Packages with Reflective Layer

Figure 3:
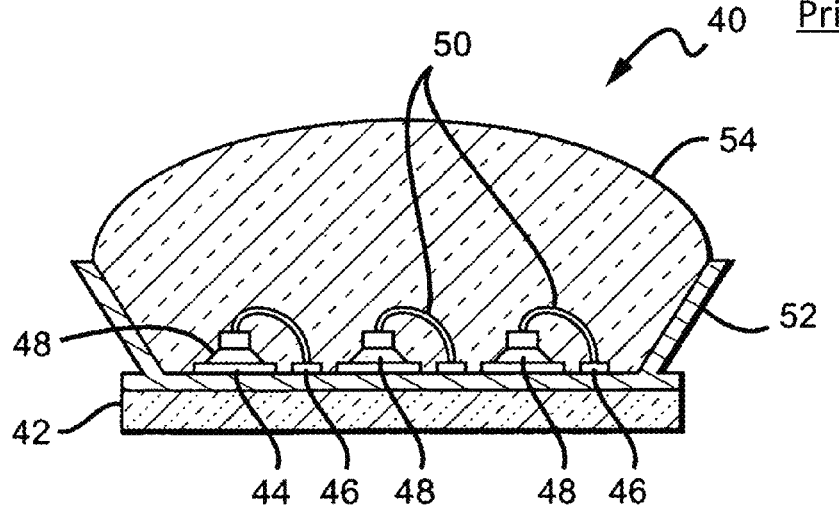
FIG. 3 shows a sectional view of one embodiment of a prior art LED component.

FIG. 3 shows a conventional LED component 40 comprising a submount 42 for holding an array of LED chips, with the submount having die pads 44 and conductive traces 46 on its top surface. LED chips 48 are included that comprise the LED array, with each of the LED chips 48 mounted to a respective one of the die pads 44. Wire bonds 50 pass between the conductive traces 46 and each of the LED chips 48 with an electrical signal applied to each of the LED chips 48 through its respective one of the die pads 44 and the wire bonds 50. Alternatively, LED chips 48 may comprise coplanar electrical contacts on one side of the LED (bottom side) with the majority of the light emitting surface being located on the LED side opposing the electrical contacts (upper side). Such flip-chip LEDs can be mounted onto the submount 42 by mounting contacts corresponding to one electrode (anode or cathode, respectively) onto the die pad 44. The contacts of the other LED electrode (cathode or anode, respectively) can be mounted to the traces 46. An optional reflector element 52 can be included that is mounted to submount around the LED chips 48, although in other embodiments the reflector can be arranged in different locations and can be shaped differently. One or more of the LED chips 48 in this embodiment can emit at a single color, or one or more of the LED chips 48 can be coated with a down-converting phosphor with each type of LEDs being connected at least into one series connection circuit. For example, different color LED's can be arranged on the substrate, e.g., combinations of blue/green/red LED's, blue LED's with yellow phosphor adjacent red LED's, and the like. Alternatively, multiple types of LEDs can be simultaneously mounted on the submount 42 with independent series circuits, respectively. An optical element in the form of an encapsulant 54 such as a lens is included over the LED chips 48.

Figure 4:
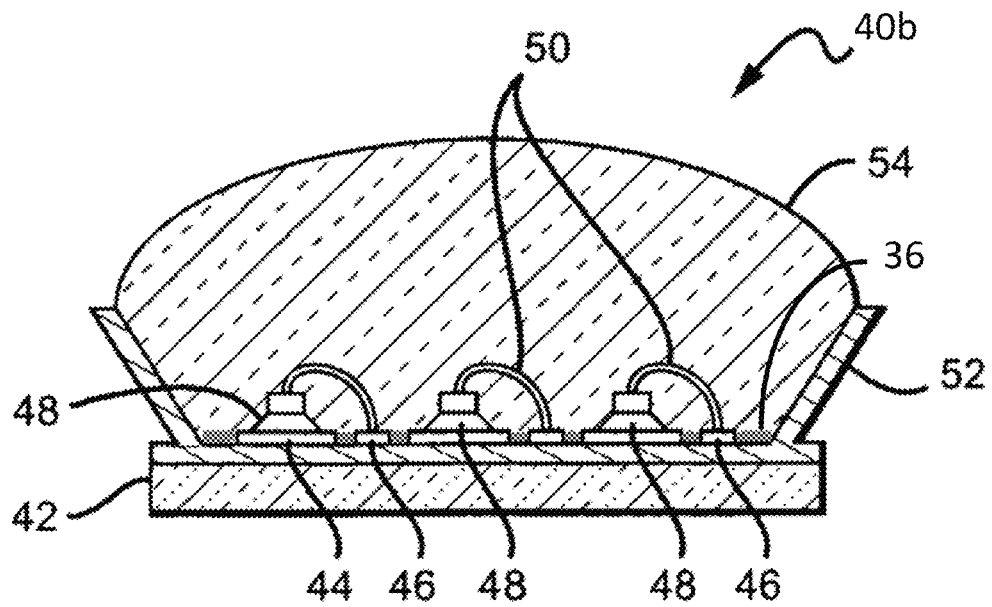
FIG. 4 is a sectional view of an embodiment of an LED component according to the present disclosure.

FIG. 4 shows a LED component 40a according to the present disclosure having beveled-edge LED chips 48 and reflective layer 36 positioned between the LED chips 48. In this exemplary aspect, the reflective layer 36 essentially surrounds the LED chips 48 and is flush with the light emitting edge or surface of the LED chips 48 so as to provide essentially a planar surface over the substrate 42 comprised of the reflective layer 36 and the light emitting surface of the LED chips 48. In other aspects, the reflective layer 36 is non-planar and/or contains planar and non-planar sections, such as an upwards/downwards taper at the edge of the LED's component and/or in proximity to the metal reflector element 52. In certain aspects, the reflective layer 36 essentially surrounds the LED chips. In certain aspects, the reflective layer 36 essentially surrounds the light emitting edges of the LED chips, up to but not including the top surface of the LED chips (not shown). In other aspects, the reflective layer 36 touches the at least one of the LED chips 48. It is understood that any depiction of a taper of the LED's edge and/or the reflective layer is not limited to that depicted in FIG. 4.

The LED component 40a is shown with three LED chips 48, but it is understood that more LED chips can be included. At least some of the LED chips 48 are interconnected in series to minimize the number of contacts to the LED component and to allow operation with suitable drivers at the desired drive current, such as in the range of 50 to 150 mA. The "dead space" between LED chips is typically less than 0.50 mm and as shown in FIG. 4, is at least partially covered by reflective layer 36. In certain aspects, the dead space between LED chips is completely covered by the reflective layer 36. In one embodiment, the spacing is 0.15 mm to 0.01 mm depending on the mounting process, allowing for the LED components to be densely arranged on the top surface of submount 42. This allows for smaller sized devices that can have a form factor of existing lamps or even smaller, and can provide the ability to shape the output beam into a particular angular distribution. Other LED chip spacing dimensions can be employed, for example, greater than 0.15 mm or less than 0.01 mm. In other aspects, the LED chip 48 spacing is such that when the reflective layer 36 (or its precursor components) is introduced to the array of LED chips 48, the reflective layer 36 is wicked between the channels formed between the individual LED chips 48 of the array. Reflective layer 36 preferably is non-conducting, and therefore provides for the ability to reduce the LED array footprint by reducing the spacing between individual LED elements.

Figure 5:
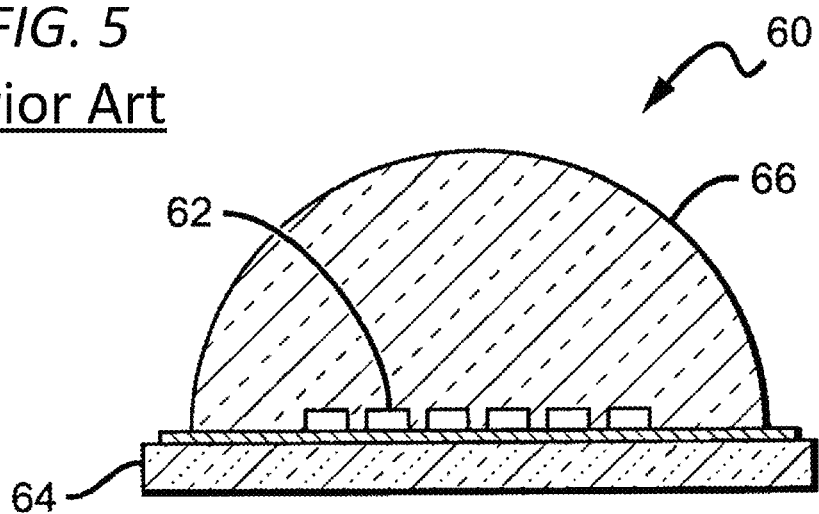
FIG. 5 shows a sectional view of one embodiment of a prior art LED component.

FIG. 5 shows a conventional monolithic LED package 60 comprising an array of LED chips 62 mounted on the surface of a submount 64 with optical element 66. At least some of the LED chips 62 are interconnected in a series circuit.

Figure 6:
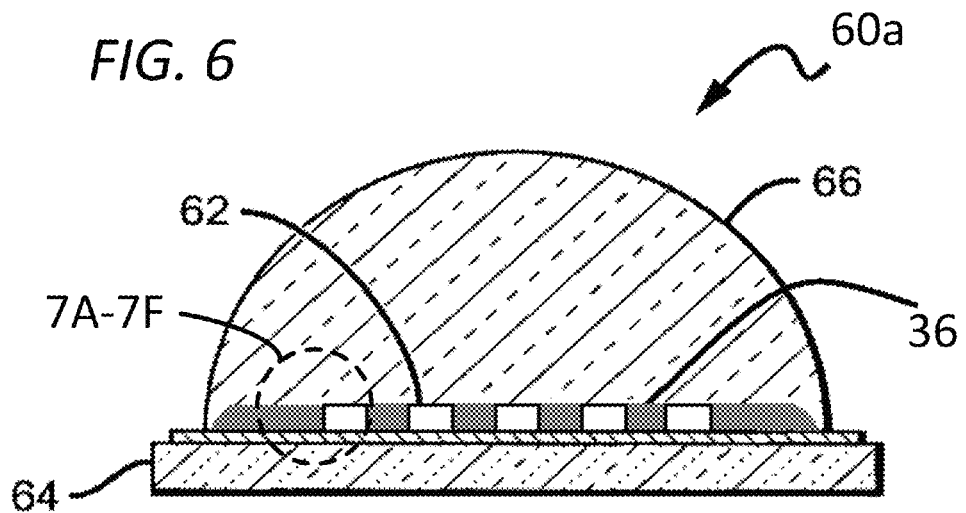
FIG. 6 is a sectional view of an embodiment of another LED component according to the present disclosure.

FIG. 6 shows a monolithic LED component 60a comprising an array of LED chips 62 mounted on the surface of a submount 64 in accordance with the present disclosure. In a manner as discussed below, reflective layer 36 is formed between the LED chips 62. The reflective layer 36, which can be deposited as described below, covers the electrical traces/pads 72, heat transfer materials 39, etc. In this exemplary aspect, the reflective layer 36 essentially surrounds the LED chips 62 and is flush with the light emitting surface of the LED chips 62 to provide essentially a planar surface comprised of the reflective layer 36 and the bottom edges of the LED chips 62. In other aspects, the reflective layer 36 of a thickness less than the vertical height of the bottom light emitting surface of the LED elements. In other aspects, the reflective layer 36 is non-planar and/or contains planar and non-planar sections. In certain aspects, the reflective layer 36 completely surrounds the LED chips 62, providing essentially a planar surface, and is flush with the bottom edge of the light emitting surface of the LED chips 62.

The LED chips 62 are preferably mounted on a substantially planar surface of the submount 64 and are arranged under a single optical lens element. In other embodiments, the LED chips can be mounted on a non-planar substrate or submount. In the embodiment shown, the component 60a can be configured to emit white light at a desired color point and color rendering index as a combination of light from the various LEDs, and simultaneously emits a predetermined luminous flux at high efficacy. Use of the reflective layer 36 in this configuration allows for light that otherwise would be absorbed to be reflected, providing a net gain in total luminous flux for the LED package. Color shifting elements can be employed in this configuration.

For example, the LED chips 62 can be coated with one or more phosphors with the phosphors absorbing at least some of the LED light and emitting a different wavelength of light such that the LED emits a combination of light from the LED and the phosphor. In one aspect, one or more phosphors can be compounded with the reflective layer 36. For example, the one or more phosphors can be included in the transparent matrix together with the highly reflective material. In other aspects, each of the LED chips 62 can be coated with one or more color shifting elements and employed in combination with the reflective layer 36. Thus, in one aspect, the LED chips 62 can be coated with one or more phosphors and the reflective layer 36 can be applied on/over the phosphor coating and/or comprise one or more phosphors.

Figure 7A:
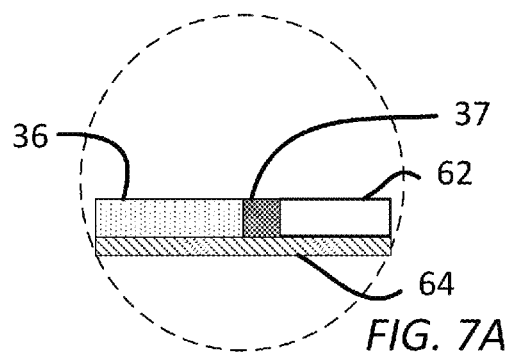
FIGS. 7A-7F are partial sectional views of FIG. 6 representing alternate embodiments of the present disclosure.
Figure 7B:
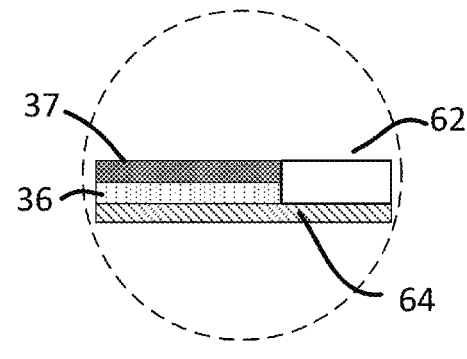
Figure 7C:
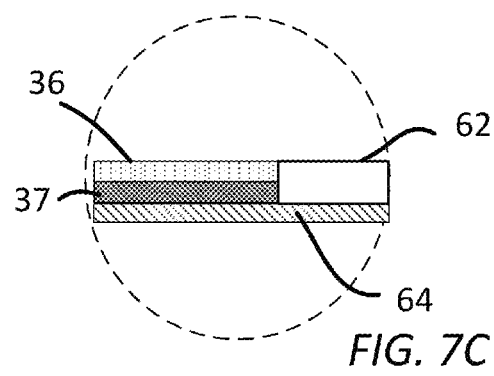
Figure 7D:
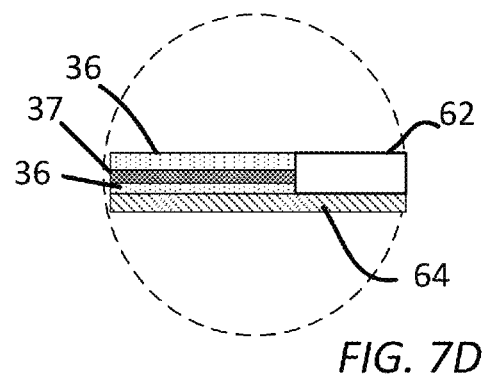
Figure 7E:
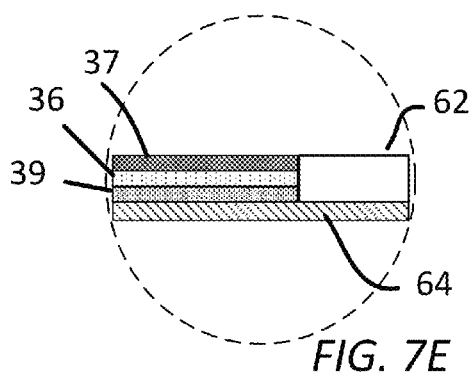
Figure 7F:
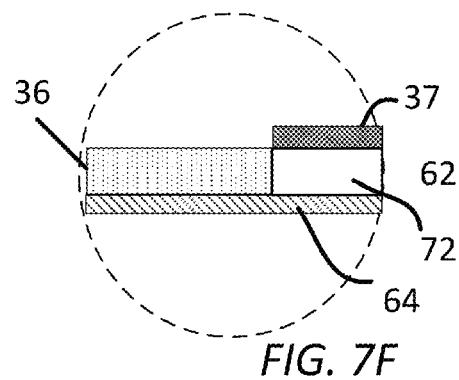

FIGS. 7A-7E are exploded views of the callout 7A-7E of FIG. 6, depicting alternate embodiments of the combination and/or arrangement of the reflective layer and color shifting elements. Thus, FIG. 7A depicts the LED chip 62 with adjacent phosphor coating 37 at least partially surrounded by reflective layer 36. FIG. 7B depicts the reflective layer 36 touching the LED chip 62 and at least partially coating substrate 64 with the phosphor coating 37 positioned on the reflective layer 36. FIG. 7C depicts the phosphor coating 37 at least partially coating substrate 64 and touching the LED chip 62 with reflective layer 36 formed on the phosphor coating 37. FIG. 7D depicts the phosphor coating 37 positioned between the reflective layers 36. FIG. 7E depicts the reflective layer 36 touching the LED chip 62 and at least partially coating heat transfer material 39 (e.g. AlN) with the phosphor coating 37 positioned on the reflective layer. FIG. 7F depicts the reflective layer 36 touching the LED chip 62 and the phosphor coating 37 positioned on the LED chip 62. Other possible configurations of the above elements may be employed, such as the phosphor coating 37 at least partially coating the heat transfer material 39 with the reflective layer formed on the phosphor coating 37.

In one exemplary embodiment according to the present disclosure, the LED chips 62 are configured to provide a resultant white light, e.g., cool white or warm white. For example, LEDs chips 62 can have an LED that emits light in the blue wavelength spectrum and the phosphor absorbs some of the blue light and re-emits yellow, with the LED chips 62 emitting a white light combination of blue and yellow light. In one embodiment, the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include, for example: $Tb_{3-x}RE_xO_{12}$:Ce(TAG); RE=Y, Gd, La, Lu; or $Sr_{2-x-y}Ba_xCa_ySiO_4$:Eu.

The LED chips 62 can be configured for emitting red light, for example, they can comprise LED structures and materials that permit emission of red light directly from the active region. Alternatively, in other embodiments, the LED chips 62 can comprise LEDs covered by a phosphor that absorbs the LED light and emits a red light. Some phosphors appropriate for these structures can comprise, for example: Red $Lu_2O_3$: $Eu^{3+}$ $(Sr_{2-x}La_x)(Ce_{1-x}Eu_x)O_4$ $Sr_2Ce_{1-x}Eu_xO_4$ $Sr_{2-x}Eu_xCeO_4$ $SrTiO_3$:$Pr^{3+}$, $Ga^{3+}$ $CaAlSiN_3$:$Eu^{2+}$ $Sr_2Si_5N_8$:$Eu^{2+}$. Other structures, arrangements, and combinations of single and/or multi-color LED-phosphor chips can be employed to provide a desired lighting effect, as is generally known in the art.

The submount 64 can be formed of many different materials with a preferred material being electrically insulating, such as a dielectric element, with the submount being between the LED array and the component backside. The submount can comprise a ceramic such as alumina, aluminum nitride, silicon carbide, or a polymeric material such as polyimide and polyester etc. In the preferred embodiment, the dielectric material has a high thermal conductivity such as with aluminum nitride and silicon carbide.

In other aspects of the above embodiments, the submount 64 can also comprise additional highly reflective material, such as reflective ceramic or metal layers like silver, to enhance light extraction from the component and/or complement the reflective layer 36. The surface of the submount 64 can be pre-treated with adhesion promoters and/or coupling agents known in the art to improve the adhesion of the reflective layer 36 to the surface of the submount, sides/edges of the LED chips providing that such adhesion methods do not substantially degrade the performance of the LED elements or package.

In other embodiments the submount 64 can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used such as standard FR-4 PCB, metal core PCB, or any other type of printed circuit board.

It is understood that LED components according to the present disclosure can be fabricated using a method that incorporates submount panel or wafer comprising a plurality of submounts. Each of the submounts 64 can be formed with its own array of LEDs and optical elements 66 such that multiple LED chips 62 can be formed across the submount panel. Multiple LED chips 62 can then be singulated from the submount panel. Each submount 64 may also comprise a more complex combination of elements such as a plurality of "submount" assemblies which are mounted on a planar surface of submount. As more fully described below, the submount assemblies can have different functionalities such as providing electrostatic discharge (ESD) protection for the various LED chips. In such embodiments, the reflective layer 36 can be employed as described above so that the reflective layer 36 essentially surrounds the LED chips and is flush with the top surface of the LED chips.

The size of the submount 64 in LED package 60 can vary depending on certain factors such as the size and number of LEDs. In one embodiment, the sides of the submount can be approximately 12 mm by 13 mm. It is further understood that the submount 64 can have other shapes including circular, oval, rectangular, hexagonal or other multiple sided shapes.

Figure 8:
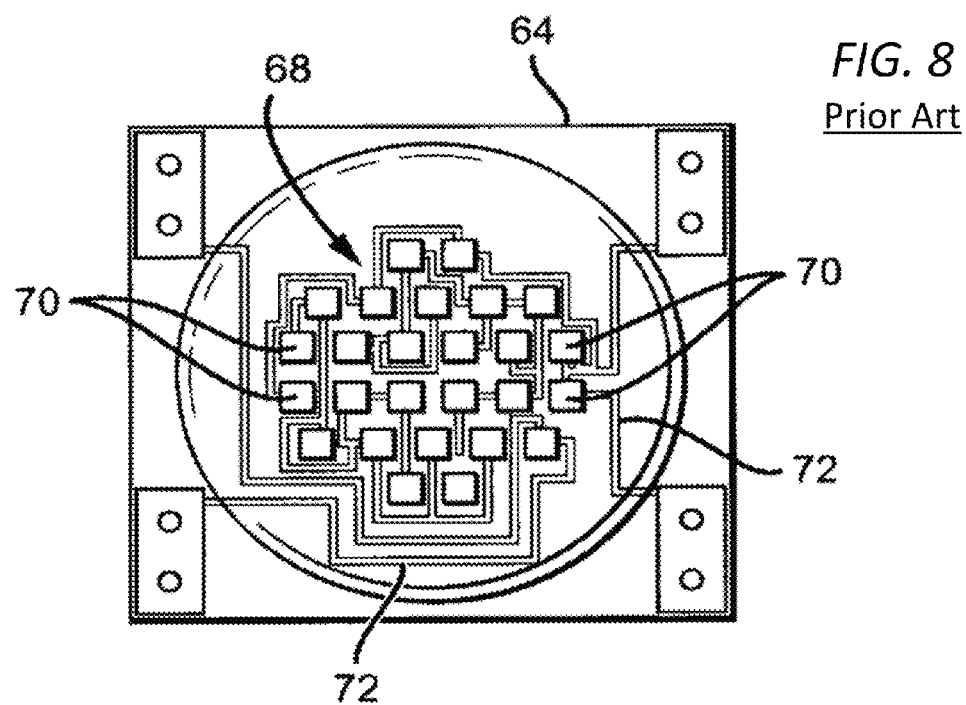
FIG. 8 is a top view of a prior art LED component.

Referring now to FIG. 8, the top surface of a conventional submount 64 is shown having planar surface with patterned conductive features 68 that can include die attach pads 70 and interconnecting conductive traces 72. These features 68 provide conductive paths for electrical connection to the LED chips 62 using known contacting methods. Each of the LED chips 62 (not shown) can be mounted to a respective one of the attach pads 70 using known methods and material mounting using conventional solder materials that may or may not contain a flux material. The LED chips 62 can similarly be mounted and electrically connected to the conductive traces 72 using known surface mount or wire bonding methods depending on the geometry of the LED chips 62. Alternatively, flip chip LEDs can be mounted as described above on the attach pads and conductive traces. The attach pads 70 and interconnecting traces 72 can comprise many different materials, such as metals or other conductive materials, and in one embodiment they can comprise copper deposited using known techniques such as plating.

Figure 9:
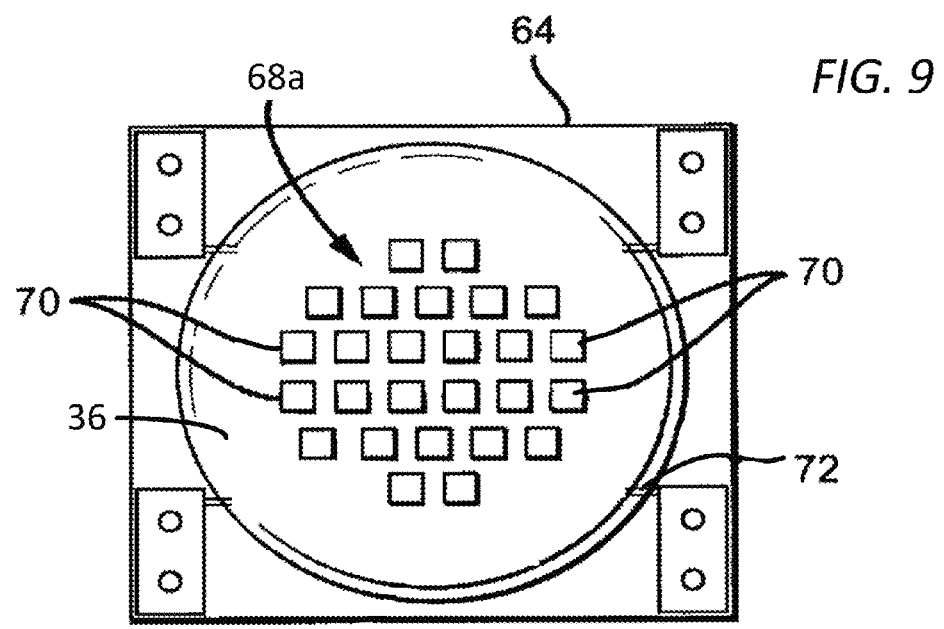
FIG. 9 shows a top view of an LED component according to the present disclosure.

Referring now to FIG. 9, the top surface of the submount 64 according to the present disclosure is shown having planar surface with reflective layer 36 covering its patterned conductive features 68a (not shown, but similar to that of FIG. 8) that can include die attach pads and interconnecting conductive traces 72. Each of the LED chips 62 (not shown) preferably can be pre-mounted and wire bonded to a respective one of the attach pads using known methods and material mounting using conventional solder materials that may or may not contain a flux material. As discussed below, the LED chips preferably can similarly be pre-mounted and electrically connected to conductive traces using known surface mount or wire bonding methods depending on the geometry of the LED chips 62 prior to introduction and/or forming of the reflective layer 36. The reflective layer 36 can be configured to provide essentially a planar surface that includes the top face of the LED chips and the reflective layer 36 as described above. In one aspect, the array comprises flip chip LEDs mounted as described above on the attach pads and conductive traces.

Figure 10A:
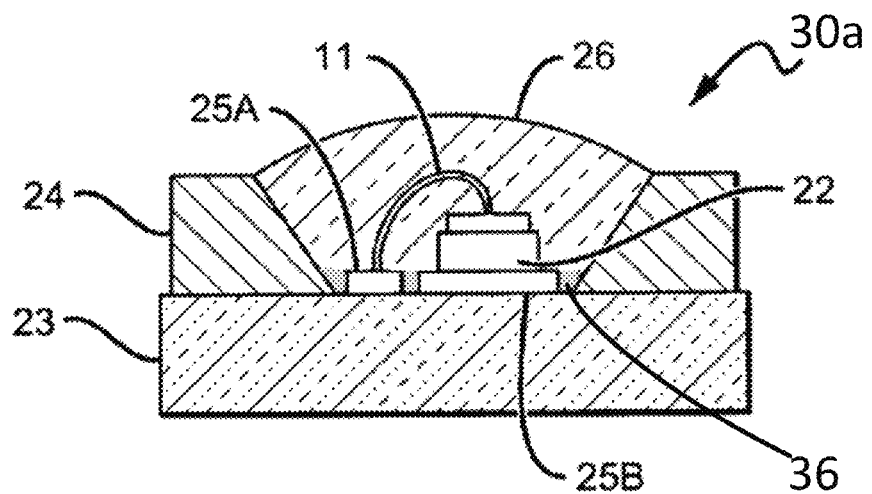
FIGS. 10A-10B are sectional views of an embodiment of a single LED component package according to the present disclosure.
Figure 10B:
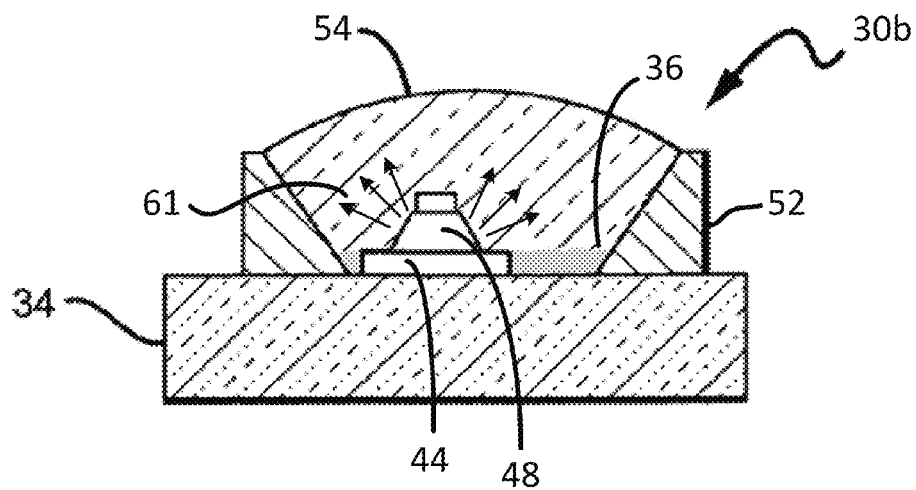

In another embodiment, single LED element luminary packages can also be provided. Thus, FIGS. 10A and 10B depict LED packages including the reflective layer 36 as described above. FIG. 10A depicts a high power LED package 30a, with one LED chip 22, mounted onto a carrier such as a printed circuit board (PCB) carrier, substrate or submount 23. Reflective layer 36 is shown at a thickness essentially equal to the light emitting surface of LED chip 22. In other aspects, the reflective layer 36 is of a thickness (height) such that it is flush with the top surface of the LED chip 22. A metal reflector 24 mounted on the submount 23 surrounds the LED chip 22. One or more wire bond connections 11 are made between ohmic contacts on the LED chips 22 and electrical traces 25A, 25B on the submount 23. The mounted LED chip 22 and reflective layer 36 are then covered with an encapsulant 26, which may provide environmental and mechanical protection to the chips while also acting as a lens. The metal reflector 24 is typically attached to the carrier by means of a solder or epoxy bond. Other configurations of the single LED luminary of FIG. 10A, with reflective layer 36 can be employed, for example, such as a flip-chip configuration.

FIG. 10B depicts a flip chip LED package 30b having a single, beveled-edge LED chip 48 emitting light 61, and reflective layer 36 positioned between the LED chip 48 and the metal reflector element 52. In this exemplary aspect, the reflective layer 36 essentially surrounds the LED chip 48 and is flush with the lower light emitting edge or surface of the LED chip 48, covering substrate 34. In other aspects, the reflective layer 36 is of a thickness (height) such that it is flush with the top surface of the LED chip 48.

Thus, the present disclosure is directed to application of the reflective layer on many different LED chip arrangements. In other aspects, application of the reflective layer on many different LED chip arrangements with the individual LED chips either coated by a converting phosphor or emitting light directly from their active region, are provided. In one alternative embodiment, a single or plurality of series connected LED chip circuits can comprise LED chips wherein all are coated with a single down-converting material. The mixed emission from the LED and the down-converting material can be cool or warm light. In one embodiment, all the LED chips emitter are blue LEDs covered with phosphor. In certain aspects, the phosphor can be incorporated into the reflective layer and used in combination coated LED chips.

It is understood that the LED chips in the arrays including the reflective layer as herein disclosed and described can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference.

Another embodiment can comprise a single or plurality of series connection LED circuits, with all the LED chips comprising LEDs being coated with and/or containing the reflective layer 36 comprising two or more down-converting materials like a phosphor. The combined LED and phosphor emission can cover different spectral ranges such as blue, green, yellow and red spectral ranges. The mixed emission can be cool or warm white light with a color point on the black body locus or within an 8-step MacAdam ellipse thereof with high color rendering index of greater that 85. The phosphor composition can be for example selected from materials discussed above and/or combined with the reflective layer.

In still other embodiments of an LED component according to the present disclosure can comprise a plurality of series connection circuits comprising LED chips that emit light directly from their active region, with at least one series circuit provided for red, green and blue emitting LEDs, respectively. In other embodiments series connected LEDs circuits can also be added emitting cyan, yellow and/or amber. The LED component preferably emits a white light combination of light from the series circuits that has a high color rendering index of greater than 85. The reflective layer can comprise a plurality of highly reflective materials each of which is chosen to maximize reflection of a corresponding wavelength of light from such an array of LED chips. Likewise, the transparent matrix of the reflective layer can be chosen to maximize the transmission of the many wavelengths of light and/or to attenuate a predetermined wavelength(s) of light for a particular optical affect.

Still other embodiments can comprise different LED chips with LEDs emitting at different wavelengths. For example, in any of the LED chip configurations above in which at least one of the emitters comprises a short wavelength emitter in conjunction with one or more phosphor emitters, an ultraviolet emitting LED can be used as the LED. The transparent matrix of the reflective layer preferably is substantially transparent in the UV region associated with the ultraviolet emitting LED (e.g., polydimethylsiloxanes). This results in the predominant emission component of the LED chips coming from the phosphor excited by the ultraviolet LED. The phosphor emitter can be included in the transparent matrix or applied to the package separately in combination with the reflective layer. By way of example, each of the following phosphors exhibits excitation in the UV emission spectrum, provides a desirable peak emission, has efficient light conversion, and has acceptable Stokes shift, for example: Yellow/Green: $(Sr,Ca,Ba)(Al,Ga)_2S_4:Eu^{2+}$ $Ba_2(Mg,Zn)Si_2O_7:Eu^{2+}$ $Gd_{0.46}Sr_{0.31}Al_{1.23}O_xF_{1.38}:Eu^{2+}_{0.06}$ $(Ba_{1-x-y}Sr_xCa_y)SiO_4:Eu$ $Ba_2SiO_4:Eu^{2+}$.

The LED components according to the present disclosure are particularly applicable to integration is solid state lighting luminares, and provide for surface mount or wire bond mounting in the luminares. The LED components provide an improvement in the lumens provided per cost, due to the reduced assembly requirements and footprint in luminaries along with reduced driver costs. The use of the reflective layer in accordance with the present disclosure provides for improved luminous flux and can be achieved with low cost materials and minimum additional manufacturing costs.

Forming the Reflective Layer

In another embodiment of the present disclosure, a method of forming the reflective layer for a LED package capable of improving luminous efficacy and minimizing loss of luminous flux is provided. Thus, a manufacturing method is provided comprising providing a solid state lighting package comprising: at least one LED element mounted on a top surface of a substrate or submount and introducing a reflective layer to the at least one LED element and covering a least a portion of the top surface of the substrate or submount. In one aspect, the method comprises providing a solid state lighting package comprising: a plurality of LED elements mounted on a top surface of a substrate or submount, the plurality of LED elements arranged so as to form channels therebetween; and introducing a low index of refraction transparent matrix comprising a high index of refraction material dispersed, distributed, or suspended therein to the channels; and forming a reflective layer around the at least one LED element and a least a portion of the top surface of the substrate or submount.

Thus, in one exemplary embodiment, there is provided a solid state lighting package comprising: a substrate or submount having attached thereto at least one LED element; and a reflective layer formed around the at least one LED element and covering at least a portion of the substrate or submount surface. The reflective layer can be of a vertical height relative to the LED chips that is a height flush with the top surface of the LED chips (e.g., surrounding and/or touching the vertical sides of the LED chips) or can be of any height less than the top surface of the LED chips.

In one aspect, the reflective layer can be produced by providing a transparent matrix material and dispersing, distributing, and/or suspending one or more of a foaming agent and/or a highly reflective material using known compounding and/or dispersive/distributive mixing techniques. In certain aspects, the transparent matrix is a two-part, curable formulation. In such aspects, the one or more of foaming agent and/or highly reflective material can be introduced to either or both of the two-part portions, provided that it does not substantially affect the curing of the matrix. Thus, for example, a predetermined amount of titanium dioxide can be added to one part of a two-part curable silicone resin to provide a precursor formulation suitable for use as described below. In another aspect, the transparent matrix can be introduced to the substrate or submount and then the one or more foaming agent and/or highly reflective material can be incorporated in the transparent matrix. Incorporation includes providing an equal distribution or concentration gradient of the one or more foaming agent and/or highly reflective material in the thickness of the transparent matrix.

Figure 11A:
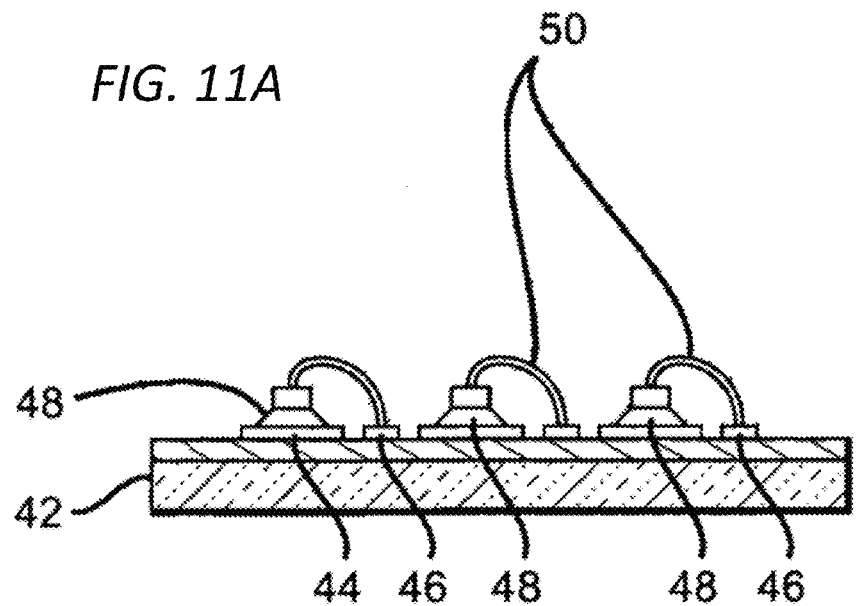
FIGS. 11A-11D are sectional views of a manufacturing embodiment of an LED component according to the present disclosure.
Figure 11B:
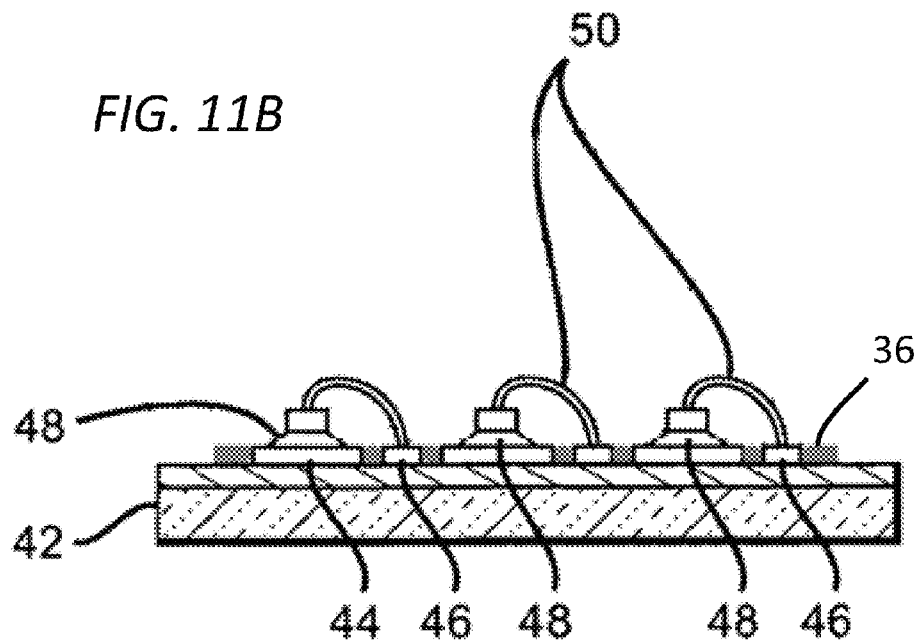
Figure 11C:
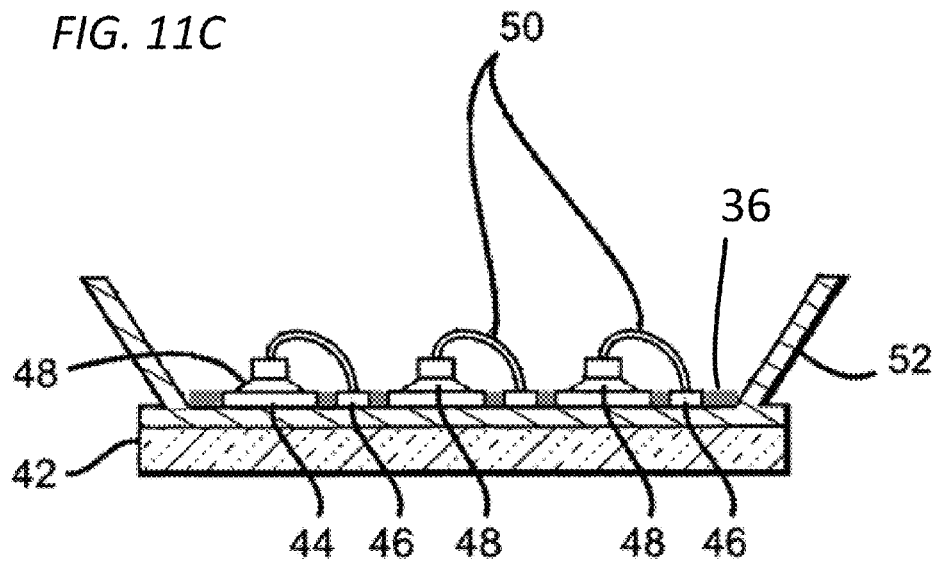
Figure 11D:
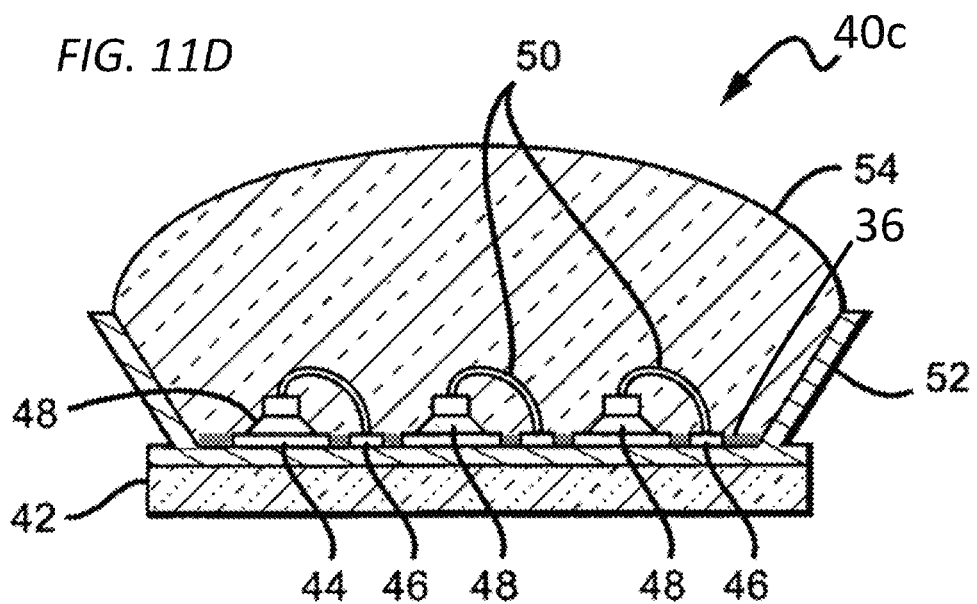

With reference to FIGS. 11A-11D, one aspect of the presently disclosed method is described, where the reflective layer is introduced to a previously post die attached and wire bonded LED element(s) with subsequent formation of a metal reflective element. Thus, FIG. 11A depicts an array of mounted LED chips 48 on substrate 42 having die pads 44 and conductive traces 46 and wire bonds 50. FIG. 11B depicts after introduction of the reflective layer 36 at least partially covering the substrate 42 and surrounding die pads 44, 46. The reflective layer 36 can be a vertical height relative to the LED chips that is a height flush with the top surface of the LED chips (e.g., surrounding and/or touching the vertical sides of the LED chips) or can be of any height less than the top surface of the LED chips. FIG. 11C depicts after bonding of the metal reflective element 52. Masking techniques can be used to introduce and/or remove portions of the reflective layer 36 from substrate 42 to provide for bonding of the metal reflective element 52 to the substrate 42. FIG. 11D depicts after introduction of the encapsulant 54 to provide LED package 40c.

Figure 12:
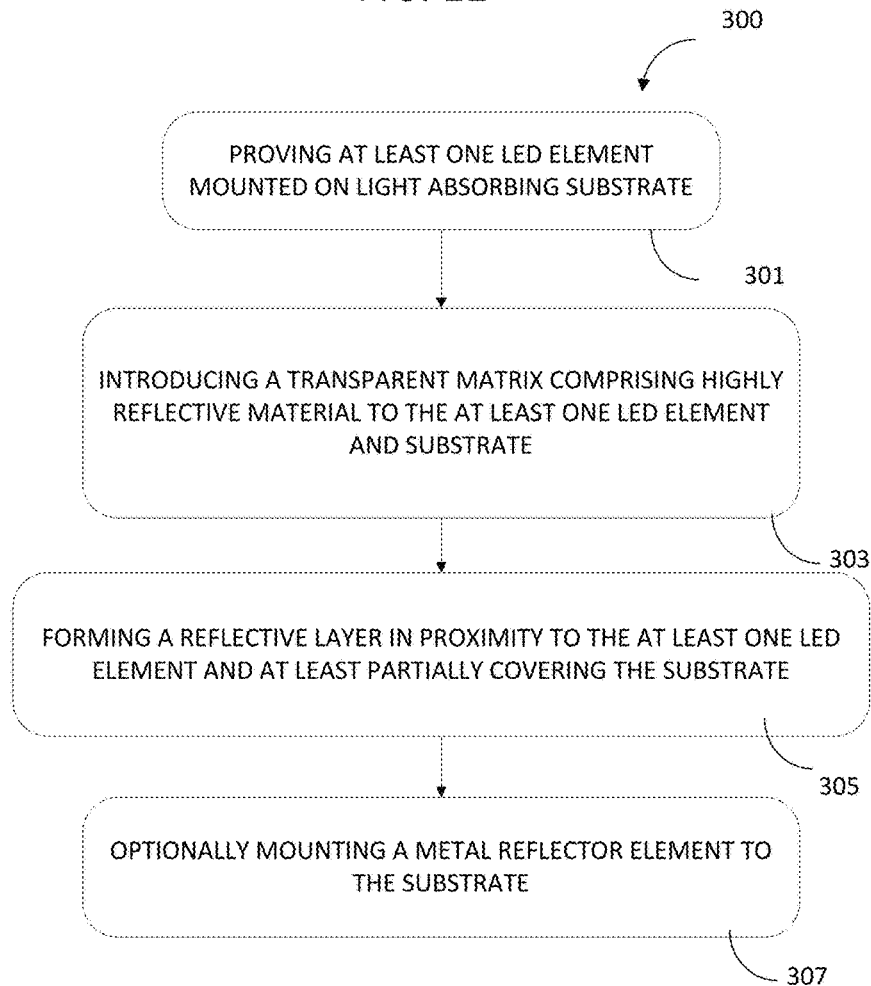
FIG. 12 is a flow chart of a manufacturing embodiment of an LED component according to the present disclosure.

With reference to FIG. 12, describing the manufacturing method of the solid state lighting package, flow chart 300, step 301 includes providing at least one LED element mounted on a substrate or submount, the substrate or submount capable of absorbing the light emitted by the LED element. Step 303 refers to the introduction of the transparent matrix comprising the highly reflective material to the at least one LED element and substrate. Step 305 refers to the forming of the reflective layer in proximity to the LED element, and covering a least a portion of the substrate or submount. Masking techniques can be used to introduce and/or remove portions of the reflective layer. The reflective layer can be of a vertical height relative to the LED chips that is a height flush with the top surface of the LED chips (e.g., surrounding and/or touching the vertical sides of the LED chips) or can be of any height less than the top surface of the LED chips. Step 307 refers to the optional mounting of a metal reflective element to the substrate.

With reference to FIG. 13 and flow chart 400, an aspect of the manufacturing method is provided, where step 401 includes providing an array of LED elements mounted on a substrate or submount, the substrate or submount capable of absorbing the light emitted by the LED element. The array of LED elements provide for one or more channels between the LED chips. The size of the array can be small (e.g., 2×2) or large (>2×2). Step 403 refers to the introduction of the transparent matrix (the foamed transparent polymer matrix and/or the transparent matrix comprising the highly reflective material as described above) of a viscosity to wick the reflective layer (or its pre-cured precursor(s)) into the one or more channels formed by the LED chips of the array and substrate. The combined viscosity of the matrix (e.g., pre-cured, two-part formulation, curable one-part formulation, or molten/solvent-castable formulation) is preferably chosen so as to provide for wicking or capillary drawing of the formulation in-between the spacing or channels of arrayed LED elements. This provides for the introduction of the reflective layer on planar or non-planar substrates. Once the pre-cured, combined two-part transparent matrix material has been wicked between the LED elements and has leveled to a predetermined height relative to that of the light emitting surface of the LED elements, the matrix is allowed to (optionally foam), cure, harden, or set. Curing can be performed with or without the use of heat and/or light. While the above example is exemplified by using to a two-part silicone matrix, other suitable transparent matrixes can be substituted and configured with the predetermined loading of one or more of foaming agent and/or highly reflective material and viscosity adjusted to provide for the introduction thereof about the LED elements as described above. For example, a transparent matrix comprising one or more of the foaming agent and/or the highly reflective material can be melted at a temperature below the solder flow point and introduced to the LED chips and substrate, the melted matrix having a viscosity capable of providing wicking. Alternatively, the transparent matrix and one or more of the foaming agent and/or the highly reflective material can be solvent-diluted to a sufficient viscosity to provide wicking and then the solvent driven off (and optionally foamed) using heat. Step 405 refers to forming of the reflective layer to the LED element and covering a least a portion of the substrate or submount. The reflective layer can be of a vertical height relative to the LED chips that is a height flush with the top surface of the LED chips (e.g., surrounding and/or touching the vertical sides of the LED chips) or can be of any height less than the top surface of the LED chips. Step 407 refers to the optional mounting of a metal reflective element to the substrate.

With reference to FIG. 14, describing the manufacturing method of the solid state lighting package, flow chart 500, step 501 includes providing at least one LED element mounted on a substrate or submount, the substrate or submount capable of absorbing the light emitted by the LED element. Step 503 refers to the introduction of the transparent matrix comprising the foaming agent to the at least one LED element and substrate. Step 505 refers to the forming of the reflective layer comprising a cellular structure in proximity to the LED element and covering a least a portion of the substrate or submount. The cellular structure is configured to reflect light emitted by the at least one LED element. Masking techniques can be used to introduce and/or remove portions of the reflective layer. The reflective layer can be of a vertical height relative to the LED chips that is a height flush with the top surface of the LED chips (e.g., surrounding and/or touching the vertical sides of the LED chips) or can be of any height less than the top surface of the LED chips. Step 507 refers to the optional mounting of a metal reflective element to the substrate.

With reference to FIG. 15 and flow chart 600, another aspect of the manufacturing method is provided, where the transparent matrix is introduced to the at least one LED element mounted on a substrate or submount and subsequently the highly reflective material and/or foaming agent is introduced to the transparent layer. Thus, step 601 includes providing at least one LED element mounted on a substrate or submount. Step 603 refers to the introduction of the transparent matrix. Masking techniques can be used to introduce and/or remove portions of the transparent matrix. In one aspect, the transparent matrix has a viscosity sufficient to wick the transparent matrix (or its pre-cured precursor(s)) into the one or more channels formed by an array of LED chips mounted to the substrate. The combined viscosity of the matrix is preferably chosen so as to provide for wicking or capillary drawing of the formulation in-between the spacing or channels of arrayed LED elements. This provides for the introduction of the transparent matrix on planar or non-planar substrates. Step 605 refers to introducing one or more of a foaming agent and/or a highly reflective material to the transparent matrix, for example, after introduction of the transparent matrix. In one aspect, the foaming agents and/or the highly reflective material are introduced to the transparent matrix before set-up (e.g., while "tacky"). In one aspect, the at least one foaming agent and/or highly reflective material deposited on the transparent matrix can be contacted (e.g., coated, sprayed, etc.) with the same or different (e.g., harder durometer, different optical properties, etc.) transparent matrix to form a layered structure securing the foaming agent and/or highly reflective material. Alternatively or in combination, solvents (e.g., liquids and/or supercritical fluids) and/or heat can be used to urge the foaming agents and/or highly reflective material into the transparent matrix. Step 607 refers to forming of the reflective layer. Once the pre-cured, combined two-part transparent matrix material has been introduced (or wicked) between the LED elements and has leveled to a predetermined height relative to that of the light emitting surface of the LED elements, the matrix is allowed to foam, cure, harden, or set as described above. Excess foaming agent and/or highly reflective material can be subsequently removed upon curing. Curing/foaming can be performed with or without the use of heat and/or light. The transparent matrix can be foamed to comprise cells of an average diameter and of a density sufficient to reflect the emitted LED light. The reflective layer is formed so as to surround and/or touch the LED element and cover a least a portion of the substrate or submount. The reflective layer can be of a vertical height relative to the LED chips that is a height flush with the top surface of the LED chips (e.g., surrounding and/or touching the vertical sides of the LED chips) or can be of any height less than the top surface of the LED chips. Step 609 refers to the optional mounting of a metal reflective element to the substrate.

Increasing Luminous Flux

Table 1 summarizes the gain in total luminous flux for an array (2×3) of LED chips manufactured with the reflective layer according to the present disclosure compared to a similar array without the reflective layer.

TABLE 1

Mean Lm/W$^3$ for controls and LED arrays with reflective layer.

| Die | Substrate | Treatment | String | Mean (LF380 mA) | Net % Gain in LF |
|---|---|---|---|---|---|
| WZ1400 | 2X3 | Control | All-on | 465.89 | — |
| WZ1400 | 2X3 | Control | All-on | 236.28 | — |
| WZ1400 | 2X3 | Control | B-on | 247.28 | — |
| WZ1400 | 2X3 | TiO2Mix | All-on | 487.53 | >4.6 |
| WZ1400 | 2X3 | TiO2Mix | A-on | 246.91 | >4.2 |
| WZ1400 | 2X3 | TiO2Mix | B-on | 258.35 | >4.2 |

TiO2Mix = titanium dioxide 11.7 weight percent in polydimethylsiloxane resin.

Table 2 summarizes the gain in total luminous flux for (2×3) and (2×7) arrays of LED chips manufactured with the reflective layer according to the present disclosure compared to a similar array without the reflective layer. As shown in Tables 1-2, the reflective layer provided significant total mean luminous flux gains compared to control for LED chips powered up to 350 mA or more. Similar results were obtained for larger arrays (2×7) and for 150 mA drive currents. Thus, the luminous intensity and the total luminous flux increases as a function of the LED density of the package size. It was observed that for a power input of between about 150 mA to about 380 mA, and a LED array of between about 6 to about 14 LED elements, the gain in mean luminous flux (lumen/W) is increased more than about 3.5% when compared to a solid state lighting package at a similar power input and having a similar array arrangement and number of LED elements without the reflective layer. Gains of more than 4% were observed for large arrays, e.g., 2×7. For a single LED, the net gain in luminous flux was small, but measurable.

TABLE 2

Mean Lm/W for controls and LED arrays with reflective layer.

| Die | Substrate | Treatment | String | Mean (LF150 mA) | Net % Gain in LF |
|---|---|---|---|---|---|
| WZ1400 | 2X3 | Control | | 205.9 | — |
| WZ1400 | 2X3 | TiO2Mix | | 215.6 | >4.2 |
| WZ850 | 2X7 | Control | | 628.9 | — |
| WZ850 | 2X7 | TiO2Mix | | 653.2 | >3.8 |

TiO2Mix = titanium dioxide 11.7 weight percent in polydimethylsiloxane resin.

As shown in Tables 1 and 2, the solid state lighting package including the reflective layer of the present disclosure significantly increases the luminous efficacy as compared to a similar solid state lighting package without the reflective layer. Similar results were observed or can be expected for various packages including packages having metal reflectors and the like.

As the reflective layer is readily adaptable to a post-mounted, wire bonded LED package, with the reflective layer being readily introduced to the LED edges and channels in-between, minimal modification to existing LED packaging manufacturing is needed. The methods according to the present disclosure are adaptable to monolithic LED structures with or without metal reflector elements and/or modification of the reflector.

The reflective layer and methods of manufacturing, and methods of increasing the total luminous flux of a solid state lighting package are generally applicable to a variety of existing lighting packages, for example, XLamp products XM-L, ML-B, ML-E, MP-L EasyWhite, MX-3, MX-6, XP-G, XP-E, XP-C, MC-E, XR-E, XR-C, and XR LED packages manufactured by Cree, Inc. The benefits in luminous flux can be applied to many lighting applications, for example, commercial/retail display spotlights, LED retrofit bulbs, and other indoor and outdoor general-illumination applications.

The above has been described both generically and with regard to specific embodiments. Although the present disclosure has been set forth in what is believed to be the preferred embodiments, a wide variety of alternatives known to those of skill in the art can be selected within the generic disclosure. Other advantages and obvious modifications of the present disclosure will be apparent to the artisan from the above description and further through practice of the present disclosure.

I claim:

1. A solid state lighting package comprising:
    at least one die pad mounted LED element positioned on a top surface of a substrate or a submount capable of absorbing light emitted by the at least one LED element, the at least one LED element having a light emitting edge height from the substrate or submount; and
    a reflective layer comprising a transparent matrix comprising a highly reflective material, the transparent matrix being substantially transparent to wavelengths of light emitted by the at least one LED element; the reflective layer in proximity to the at least one LED element and covering at least a portion of the top surface of the substrate or the submount, wherein the reflective layer height from the substrate or submount is less than the light emitting edge height of the at least one die pad attached LED element and substantially avoids covering any part of the LED element capable of emitting light, whereby at least of portion of the light emitted by the LED element is reflected by the reflective layer.

2. The solid state lighting package of claim 1, wherein the reflective layer touches the at least one LED element.

3. The solid state lighting package of claim 1, wherein the reflective layer essentially surrounds the at least one LED element.

4. The solid state lighting package of claim 1, wherein the reflective layer comprises a transparent matrix having an index of refraction of between about 1.4 and about 1.5, and a highly reflective material having an index of refraction of between about 1.8 to about 2.4.

5. The solid state lighting package of claim 1, wherein the transparent matrix is at least one of a polysiloxane, polyurethane, polyimide, poly(meth)acrylate, epoxy, fluoropolymer, and combinations thereof.

6. The solid state lighting package of claim 1, wherein the transparent matrix is at least one of a polydialkylsiloxane, polydialkylphenylsiloxane, polydialkylalkylphenylsiloxane, and polyalklyphenylsiloxanes, or blends thereof.

7. The solid state lighting package of claim 1, wherein the highly reflective material is at least one of titanium dioxide, zinc oxide, zinc sulfide, barium sulfate, boron nitride, talc, silica, alumina, zeolite, calcium carbonate, magnesium carbonate, barium sulfate, zinc oxide, aluminum hydroxide, magnesium hydroxide, mica, montmorillonite clay, carbon particles, glass particles, carbon nanotubes, and mixtures thereof.

8. The solid state lighting package of claim 6, wherein the transparent matrix comprises a two part mixture, the highly reflective material being present in one or both of the two part mixture.

9. The solid state lighting package of claim 1, wherein the reflective layer comprises titanium dioxide and at least one of polydimethylsiloxane and polyphenylsiloxane.

10. The solid state lighting package of claim 9, wherein the titanium dioxide is present in an amount of between about 3 to about 25 weight percent.

11. The solid state lighting package of claim 1, further comprising a color shifting element.

12. The solid state lighting package of claim 1, wherein the at least one LED element comprises an array of LED elements.

13. The solid state lighting package of claim 1, wherein the substrate or submount comprises aluminum nitride.

14. A method of manufacturing a solid state lighting package comprising:
   providing an array of LED elements forming at least one channel between the LED elements of the array mounted on a substrate or submount;
   introducing a transparent matrix comprising a highly reflective material to the at least one LED element and the substrate or submount, wherein the highly reflective material is introduced having a viscosity capable of being drawn by capillary action into the at least one channel;
   urging the transparent matrix comprising the highly reflective material into the at least one channel via capillary action;
   controlling the reflective layer height from the substrate to less than the height of a light emitting surface of the at least one die pad attached LED element from the substrate or submount;
   forming a reflective layer in proximity to the at least one LED element and covering at least a portion of the substrate or submount; and
   avoiding covering any part of the LED element capable of emitting light with the reflective layer.

15. The method of claim 14, wherein the reflective layer touches the at least one LED element.

16. The method of claim 14, wherein the reflective layer essentially surrounds the at least one LED element.

17. The method of claim 14, wherein the reflective layer thickness is about equal to the maximum vertical height of the die pad.

18. The method of claim 14, wherein the transparent matrix is a two part curable material and together with the highly reflective material having an uncured viscosity capable of being drawn by capillary action into the at least one channel.

19. The method of claim 14, wherein the transparent matrix has an index of refraction of between about 1.4 and about 1.5 and the highly reflective material has an index of refraction of between about 1.8 and about 2.4.

20. The method of claim 14, wherein the highly reflective material is at least one of titanium dioxide, zinc oxide, zinc sulfide, barium sulfate, boron nitride, talc, silica, alumina, zeolite, calcium carbonate, magnesium carbonate, barium sulfate, zinc oxide, aluminum hydroxide, magnesium hydroxide, mica, montmorillonite clay, carbon particles, glass particles, carbon nanotubes, and mixtures thereof.

21. The method of claim 14, wherein the transparent matrix is at least one of a polysiloxane, polyurethane, polyimide, poly(meth)acrylate, epoxy, fluoropolymer, and combinations thereof.

22. The method of claim 14, wherein the transparent matrix is at least one of a polydialkylsiloxane, polydialkylphenylsiloxane, polydialkylalkylphenylsiloxane, and polyalklyphenylsiloxanes, or blends thereof.

23. The method of claim 14, wherein the reflective layer comprises titanium dioxide and at least one of polydimethylsiloxane and polyphenylsiloxane.

24. The method of claim 14, wherein the transparent matrix is comprises a two part curable mixture and the forming step comprising curing the transparent matrix.

25. The method of claim 14, wherein the introducing step comprises the steps of introducing the transparent matrix to the substrate or submount followed by depositing the highly reflective material.

26. The method of claim 25, further comprising covering the highly reflective material with the same or a different transparent matrix.

27. A method of increasing the luminous flux of a solid state lighting package, the method comprising:
   providing a solid state lighting package having at least one die pad mounted LED element on a substrate or submount capable of absorbing light emitted by the at least one LED element;
   providing a reflective layer comprising a transparent matrix comprising a highly reflective material, the reflective layer in proximity to the at least one LED element and covering at least a portion of the substrate or submount, the reflective layer height from the substrate or submount being less than or flush with a bottom edge height of the at least one LED element from the substrate or submount, so that the reflective layer is substantially prevented from covering any light emitting surface of the LED element; and
   reflecting light emitted by the at least one LED element by the reflective layer, thereby increasing the luminous flux of the solid state lighting package.

28. The method of claim 27, wherein the at least one LED element is post die attached and wire bonded to the substrate or submount before forming the reflective layer.

29. The method of claim 27, wherein the reflective layer touches the at least one LED element.

30. The method of claim 27, wherein the reflective layer essentially surrounds the at least one LED element.

31. The method of claim 27, wherein reflective layer thickness is equal to the maximum vertical height of the die pad.

32. The method of claim 27, wherein the reflective layer thickness is flush with the bottom edge of the light emitting surface of the at least one LED element.

33. The method of claim 27, wherein the transparent matrix has an index of refraction of between about 1.4 and about 1.5 and the highly reflective material has an index of refraction of between about 1.8 and about 2.4.

34. The method of claim 27, wherein the highly reflective material is at least one of titanium dioxide, zinc oxide, zinc sulfide, barium sulfate, boron nitride, talc, silica, alumina, zeolite, calcium carbonate, magnesium carbonate, barium sulfate, zinc oxide, aluminum hydroxide, magnesium hydroxide, mica, montmorillonite clay, carbon particles, glass particles, carbon nanotubes, and mixtures thereof.

35. The method of claim 27, wherein the transparent matrix is at least one of a polysiloxane, polyurethane, polyimide, poly(meth)acrylate, epoxy, fluoropolymer, and combinations thereof.

36. The method of claim 27, wherein the transparent matrix is at least one of a polydialkylsiloxane, polydialkylphenylsiloxane, polydialkylalkylphenylsiloxane, and polyalklyphenylsiloxanes, or blends thereof.

37. The method of claim 27, wherein the reflective layer comprises titanium dioxide and at least one of polydimethylsiloxane and polyphenylsiloxane.

38. The method of claim 27, wherein the substrate or submount comprises aluminum nitride.

39. The method of claim 27, wherein the at least one LED element comprises an array of LED elements.

40. The method of claim 39, wherein the reflective layer provides for a substantially planar surface across the substrate or submount between the array of LED elements.

41. The method of claim 27, wherein the solid state lighting package comprises an array of between about 6 to about 14 LED elements wherein at a power input of between about 150 mA to about 380 mA, the gain in mean luminous flux (lumen/W) is increased more than about 3.5% when compared to a solid state lighting package at a similar power input and having a similar array arrangement and number of LED elements without the reflective layer.

42. A solid state lighting package comprising:
at least one LED element positioned on a top surface of a substrate or a submount capable of absorbing light emitted by the at least one LED element; and
a reflective layer comprising a transparent matrix comprising a cellular structure capable of reflecting the light emitted by the LED element, the reflective layer in proximity to the at least one LED element and covering at least a portion of the top surface of the substrate or the submount, whereby at least of portion of the light emitted by the LED element is reflected by the reflective layer.

43. The solid state lighting package of claim 42, wherein the reflective layer touches the at least one LED element.

44. The solid state lighting package of claim 42, wherein the reflective layer essentially surrounds the at least one LED element.

45. The solid state lighting package of claim 42, wherein reflective layer thickness is about equal to the maximum vertical height of a light emitting edge of the at least one LED element from its corresponding mount on the substrate or submount.

46. The solid state lighting package of claim 42, wherein the reflective layer thickness is less than the maximum vertical height of the at least one LED element from its corresponding mount on the substrate or submount.

47. The solid state lighting package of claim 42, wherein the transparent matrix is at least one of a polysiloxane, polyurethane, polyimide, poly(meth)acrylate, epoxy, fluoropolymer, and combinations thereof.

48. The solid state lighting package of claim 42, further comprising a color shifting element.

49. The solid state lighting package of claim 42, wherein the cellular structure is at least one of open, closed, semi-interconnected, semi-closed, and a mixture thereof.

50. The solid state lighting package of claim 42, wherein the cellular structure has an average cell diameter of about 0.1 micron to about 50 micron.

51. The solid state lighting package of claim 42, wherein the at least one LED element comprises an array of LED elements.

52. The solid state lighting package of claim 42, wherein the substrate or submount comprises aluminum nitride.

53. A method of manufacturing a solid state lighting package comprising:
providing at least one LED element mounted on a substrate or submount;
introducing a transparent matrix comprising a foaming agent to the at least one LED element and the substrate or submount; and
forming a reflective layer comprising a cellular structure in proximity to the at least one LED element and covering at least a portion of the substrate or submount.

54. The method of claim 53, wherein the at least one LED element is post die attached and wire bonded to the substrate or submount before forming the reflective layer.

55. The method of claim 53, wherein the introducing step provides for the touching of the at least one LED element with the transparent matrix.

56. The method of claim 53, wherein the introducing step provides for essentially surrounding the at least one LED element with the transparent matrix.

57. The method of claim 53, wherein reflective layer thickness is about equal to the maximum vertical height of a light emitting edge of the at least one LED element from its corresponding mount on the substrate or submount.

58. The method of claim 53, wherein the reflective layer thickness is less than the maximum vertical height of the at least one LED element from its corresponding mount on the substrate or submount.

59. The method of claim 53, wherein the at least one LED element comprises an array of LED elements forming at least one channel between the LED elements of the array.

60. The method of claim 53, wherein the introduction step further comprises (i) providing the transparent matrix comprising the foaming agent with a viscosity capable of being drawn by capillary action into the at least one channel; (ii) urging the transparent matrix comprising the highly reflective material into the at least one channel by capillary action.

61. The method of claim 53, wherein the transparent matrix is a two part curable material and together with the foaming agent having an uncured viscosity capable of being drawn by capillary action into the at least one channel.

62. The method of claim 53, wherein the transparent matrix is comprises a two part curable mixture and the forming step comprising curing the transparent matrix.

63. The method of claim 53, wherein the foaming agent is at least one of a blowing agent, a gas-generating compound, and a solvent-extractable compound.

64. The method of claim 53, wherein the transparent matrix is at least one of a polysiloxane, polyurethane, polyimide, poly(meth)acrylate, epoxy, fluoropolymer, and combinations thereof.

65. The method of claim 53, further comprising introducing a color shifting element.

66. The method of claim 53, wherein the cellular structure is at least one of open, closed, semi-interconnected, semi-closed, and a mixture thereof.

67. The method of claim 66, wherein the cellular structure has an average cell diameter of about 0.1 micron to about 50 micron.

68. A method of increasing the luminous flux of a solid state lighting package, the method comprising:
providing a solid state lighting package having at least one LED element mounted on a substrate or submount capable of absorbing light emitted by the at least one LED element;
providing a reflective layer in proximity to the at least one LED element and covering at least a portion of the substrate or submount, wherein the reflective layer comprises a transparent matrix comprising a cellular structure; and
reflecting light emitted by the at least one LED element by the reflective layer, thereby increasing the luminous flux of the solid state lighting package.

69. The method of claim 68, wherein the at least one LED element is post die attached and wire bonded to the substrate or submount before forming the reflective layer.

70. The method of claim 68, wherein the forming step provides for touching the at least one LED element with the reflective layer.

71. The method of claim 68, wherein the forming step provides for essentially surrounding the at least one LED element.

72. The method of claim 68, wherein reflective layer thickness is about equal to the maximum vertical height of a light emitting edge of the at least one LED element from its corresponding mount on the substrate or submount.

73. The method of claim 68, wherein the reflective layer thickness is less than the maximum vertical height of the at least one LED element from its corresponding mount on the substrate or submount.

74. The method of claim 68, wherein the transparent matrix is at least one of a polysiloxane, polyurethane, polyimide, poly(meth)acrylate, epoxy, fluoropolymer, and combinations thereof.

75. The method of claim 68, wherein the transparent matrix is a two part curable material and together with the foaming agent having an uncured viscosity capable of being drawn by capillary action into the at least one channel.

76. The method of claim 68, wherein the foaming agent is at least one of a blowing agent, a gas-generating compound, and a solvent-extractable compound.

77. The method of claim 68, wherein the transparent matrix is at least one of a polysiloxane, polyurethane, polyimide, poly(meth)acrylate, epoxy, fluoropolymer, and combinations thereof.

78. The method of claim 68, further comprising introducing a color shifting element.

79. The method of claim 68, wherein the cellular structure is at least one of open, closed, semi-interconnected, semi-closed, and a mixture thereof.

80. The method of claim 79, wherein the cellular structure has an average cell diameter of about 0.1 micron to about 50 micron.

81. The method of claim 68, wherein the at least one LED element comprises an array of LED elements.

82. The solid-state lighting device of claim 1, wherein at least a portion of the reflective layer is tapered relative to the surface of the substrate or the submount.

83. The solid-state lighting device of claim 42, wherein at least a portion of the reflective layer is tapered relative to the surface of the substrate or the submount.

84. The method of claim 14, wherein at least a portion of the reflective layer is tapered relative to the surface of the substrate or the submount.

85. The method of claim 27, wherein at least a portion of the reflective layer is tapered relative to the surface of the substrate or the submount.

86. The method of claim 53, wherein at least a portion of the reflective layer is tapered relative to the surface of the substrate or the submount.

87. The method of claim 68, wherein at least a portion of the reflective layer is tapered relative to the surface of the substrate or the submount.

88. A method of manufacturing a solid state lighting package comprising:
providing at least one LED element mounted on a substrate or submount;
introducing a transparent matrix to the at least one LED element and the substrate or submount;
depositing a highly reflective material on the transparent matrix; and
forming a reflective layer in proximity to the at least one LED element and covering at least a portion of the substrate or submount.

89. The method of claim 25, further comprising covering the highly reflective material with the same or a different transparent matrix.

* * * * *